(12) United States Patent
Zhou et al.

(10) Patent No.: US 9,164,914 B1
(45) Date of Patent: Oct. 20, 2015

(54) MULTIPLE PORT ROUTING CIRCUITRY FOR FLASH MEMORY STORAGE SYSTEMS

(75) Inventors: Wei Zhou, San Jose, CA (US); Chee Hoe Chu, San Jose, CA (US); Po-Chien Chang, Saratoga, CA (US)

(73) Assignee: Marvell World Trade Ltd., St. Michael (BB)

( * ) Notice: Subject to any disclaimer, the term of this patent is extended or adjusted under 35 U.S.C. 154(b) by 860 days.

(21) Appl. No.: 12/728,757

(22) Filed: Mar. 22, 2010

Related U.S. Application Data

(60) Provisional application No. 61/167,450, filed on Apr. 7, 2009.

(51) Int. Cl.
| | |
|---|---|
| *G06F 12/02* | (2006.01) |
| *G06F 12/00* | (2006.01) |
| *G06F 13/00* | (2006.01) |
| *G06F 13/28* | (2006.01) |
| *G06F 17/30* | (2006.01) |
| *G11C 8/12* | (2006.01) |
| *G06F 12/10* | (2006.01) |
| *H01L 25/065* | (2006.01) |

(52) U.S. Cl.
CPC ............ *G06F 12/10* (2013.01); *G06F 12/0246* (2013.01); *G06F 17/30218* (2013.01); *G06F 2212/2022* (2013.01); *G06F 2212/72* (2013.01); *G06F 2212/7201* (2013.01); *G06F 2212/7208* (2013.01); *G11C 8/12* (2013.01); *H01L 25/0657* (2013.01); *H01L 2924/14* (2013.01)

(58) Field of Classification Search
None
See application file for complete search history.

(56) References Cited

U.S. PATENT DOCUMENTS

| | | | |
|---|---|---|---|
| 7,706,363 B1 * | 4/2010 | Daniel et al. ................ | 370/389 |
| 2003/0210686 A1 * | 11/2003 | Terrell et al. ................ | 370/389 |
| 2006/0069842 A1 * | 3/2006 | Meier ........................... | 710/316 |
| 2007/0050538 A1 * | 3/2007 | Northcutt et al. ............ | 711/112 |
| 2007/0293088 A1 * | 12/2007 | Hiew et al. ................... | 439/610 |
| 2008/0010435 A1 * | 1/2008 | Smith et al. .................. | 712/10 |
| 2008/0086631 A1 * | 4/2008 | Chow et al. ..................... | 713/2 |
| 2009/0172308 A1 * | 7/2009 | Prins et al. ................... | 711/154 |
| 2009/0300259 A1 * | 12/2009 | Luo et al. ..................... | 710/313 |

* cited by examiner

*Primary Examiner* — Jared Rutz
*Assistant Examiner* — Marwan Ayash

(57) ABSTRACT

An integrated circuit ("IC") may have flash memory circuitry associated with it. The IC may also have controllable routing circuitry for routing signal information (1) between the flash memory circuitry and any one of a plurality of signal ports of the IC, or (2) between various ones of those signal ports. Multiple instance of such ICs and their associated flash memory circuitries may be connected to one another via the above-mentioned signal ports to provide flash memory storage systems of any size in which data can be routed in and out at least partly via the controllable routing circuitries of the various ICs.

24 Claims, 8 Drawing Sheets

| IC 10 ID | MEM Address |
|---|---|
| Data Payload ||
| Data Payload ||
| Data Payload ||
| ⋮ ||
| Data Payload ||
| | CRC |

FIG. 6

MULTIPLE PORT ROUTING CIRCUITRY FOR FLASH MEMORY STORAGE SYSTEMS

CROSS REFERENCE TO RELATED APPLICATIONS

This application claims the benefit of U.S. provisional patent application No. 61/167,450, filed Apr. 7, 2009, which is hereby incorporated by reference herein in its entirety.

BACKGROUND

Larger data storage has been in increased demand in recent years. Data storage based on solid state flash memory offers compelling advantages in terms of read/write throughput, stability, shock and vibration resistance, etc., compared with traditional magnetic disk based storage. Some such solid state flash memory storage may need to be larger than others, and it can therefore be desirable to construct such flash memory storage systems from combinable electronic circuit modules. The present disclosure facilitates construction of flash memory storage systems of many different sizes.

SUMMARY

In accordance with certain possible aspects of the disclosure, an integrated circuit may include flash memory controller circuitry, a plurality of data signal ports, bus circuitry configured to convey data signals to and from the flash memory controller circuitry, and controllable routing circuitry configured to selectably convey signals between the bus circuitry and at least one of the ports.

In accordance with certain other possible aspects of the disclosure, in an integrated circuit as summarized above, at least some of the ports may be adapted for connection to similar ports of a similar instance of the integrated circuit.

In accordance with certain still other possible aspects of the disclosure, the controllable routing circuitry in an integrated circuit as summarized above may include crossbar switch circuitry.

In accordance with certain yet other possible aspects of the disclosure, in an integrated circuit as summarized above, the controllable routing circuitry may be further adapted to selectably convey signals between different ones of the ports.

In accordance with certain other possible aspects of the disclosure, memory circuitry may include a plurality of integrated circuits ("ICs"), each of which includes (1) flash memory controller circuitry, (2) a plurality of data signal ports, (3) bus circuitry for conveying data signals to and from the flash memory controller, and (4) controllable routing circuitry for selectably conveying signals (a) between the data signal ports and (b) between the bus circuitry and the data signal ports; a plurality of flash memory circuits, each of which is connected to a respective one of the ICs via the flash memory controller of that IC; and a plurality of inter-IC connections, each of the ICs having at least one inter-IC connection extending to another of the ICs so that each inter-IC connection extends between first and second ICs associated with that inter-IC connection, and each of the inter-IC connections connecting to a respective one of the data signal ports of each of the ICs associated with that inter-IC connection.

In accordance with certain still other possible aspects of the disclosure, each of the ICs in memory circuitry as summarized above may further include circuitry for controlling the routing circuitry of that IC with respect to which of the data signal ports that routing circuitry conveys signals between.

In accordance with certain yet other possible aspects of the disclosure, the circuitry for controlling of each of the ICs may further include circuitry for deriving from signals applied to the routing circuitry of that IC signal information for use by the circuitry for selecting which of the data signal ports that routing circuitry conveys signals between.

In accordance with certain still other possible aspects of the disclosure, in memory circuitry as summarized above, the circuitry for controlling of each of the ICs may be programmable with additional signal information for use by the circuitry for controlling which of the data signal ports that routing circuitry conveys signals between.

In accordance with certain other possible aspects of the disclosure, a method may comprise receiving signals indicative of (1) identification of an integrated circuit, (2) a flash memory address, and (3) data payload; and using the identification to control controllable routing circuitry so that at least the flash memory address and the data payload are forwarded to the integrated circuit having the identification.

In accordance with certain still other possible aspects of the disclosure, the "using" in a method as summarized above may include applying the identification to routing table circuitry in order to convert the identification to an actual port-to-port connection to be made, and applying the actual port-to-port connection to the controllable routing circuitry.

In accordance with certain yet other possible aspects of the disclosure, a method as summarized above may further include programming the routing table circuitry with programming data for use by the routing table circuitry to convert the identification to the actual port-to-port connection to be made.

In accordance with certain still other possible aspects of the disclosure, a method as summarized above may further include operating the integrated circuit having the identification to use the flash memory address to store the data payload at that flash memory address of that integrated circuit.

Further features of the disclosure, its nature and various advantages will be more apparent from the accompanying drawings and the following detailed description.

BRIEF DESCRIPTION OF THE DRAWINGS

FIG. 6 is a simplified diagram of an illustrative embodiment of a data packet in accordance with the disclosure.

DETAILED DESCRIPTION

Figure 1:
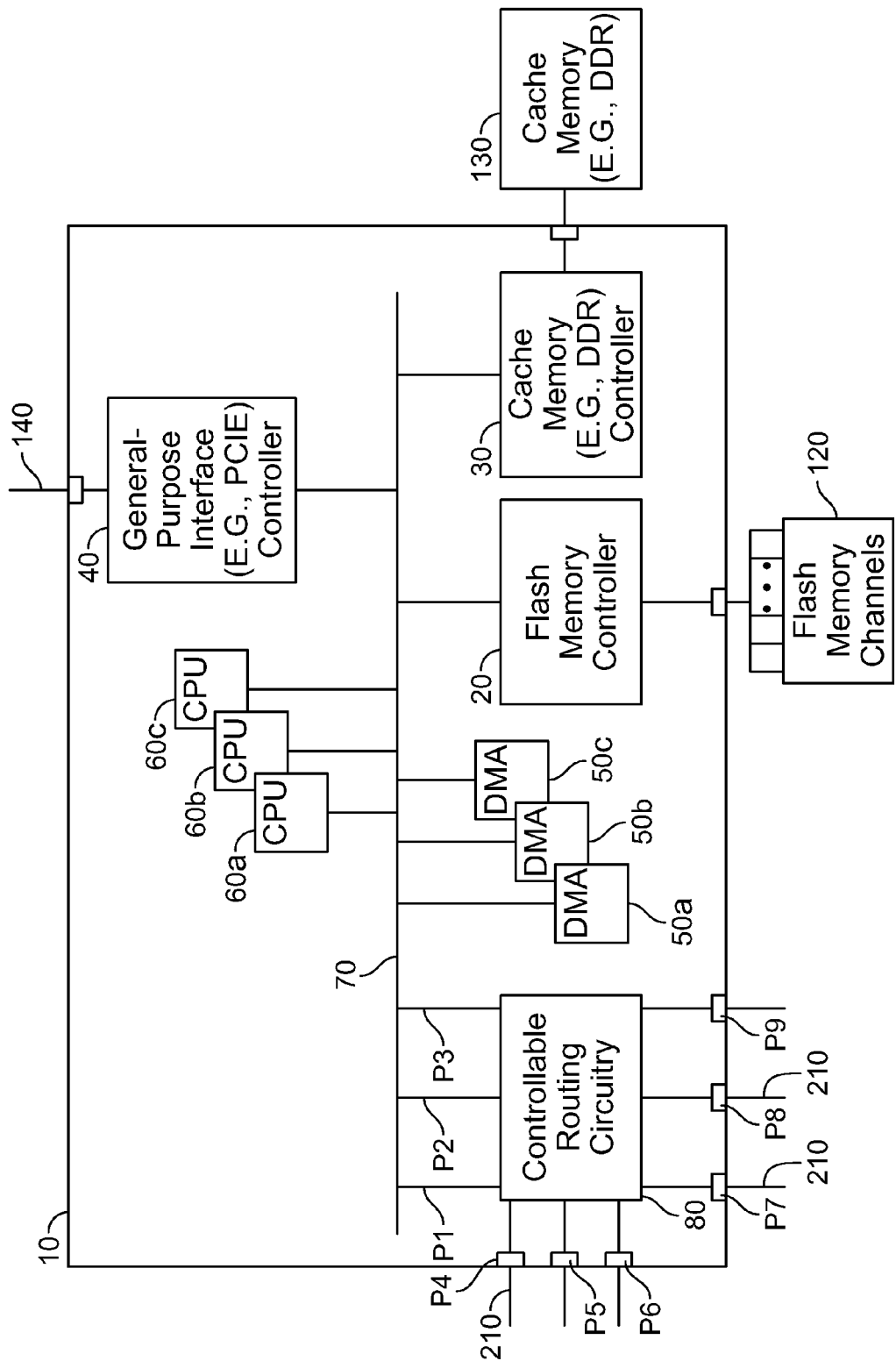
FIG. 1 is a simplified schematic block diagram of an illustrative embodiment of circuitry in accordance with this disclosure.

In accordance with certain possible aspects of the disclosure, an integrated circuit is provided that facilitates accessing large electronic data memory components (especially including flash memory components), and that also facilitates interconnecting several such integrated circuits so that those integrated circuits and their associated memory components form a clustered system that can have any of a wide range of (typically large) memory sizes. An illustrative embodiment of such an integrated circuit ("IC") 10 is shown in FIG. 1. IC 10 may also sometimes be referred to as a system on a chip ("SOC").

Among the circuitry on IC 10 is flash memory controller circuitry 20. Flash controller 20 (which can be per se conventional) controls writing data to and reading data from flash memory channel circuit components 120 that are external to (i.e., not part of) IC 10. (As used herein, words like "data" and "information" always refer to data and information embodied in electronic or electrical signal form.) For example, there may be 16 channels of external flash memory 120 associated with IC 10 via controller 20, and that flash memory may provide 512 gigabytes ("GB") of main storage (memory) for IC 10. Although flash memory 120 can thus have large data storage capacity, it can be relatively slow (in terms of time required to write data into the memory or to retrieve data from the memory) as compared to other memory associated with IC 10 as will be described later in this specification. All channels of the flash memory can be used simultaneously or used in an interleaved fashion to provide aggregated high throughput.

Also among the circuitry on IC 10 is cache memory controller circuitry 30. Cache memory controller 30 (which can be per se conventional) controls writing data to and reading data from cache memory circuitry 130 that is typically external to IC 10. For example, cache memory 130 may be double-data-rate synchronous dynamic random access memory ("DDR SDRAM") having a capacity of 4 GB. Memory 130 is preferably faster than main flash memory 120. Memory 130 is therefore usable as a cache or buffer memory for temporarily storing data on its way to or from flash memory 120.

Another part of the circuitry on IC 10 is interface controller circuitry 40 (e.g., peripheral component interface ("PCI") or peripheral component interface express ("PCIE") controller circuitry). This interface controller circuitry may again be per se conventional. It can be used for allowing IC 10 to communicate or exchange data or other information with other components in a larger system. This may be done via what may be more general-purpose connections 140 to other components of the larger system. For example, if IC 10 is part of the memory for a larger system such as a network of computers, controller 40 and connections 140 may connect IC 10 to a nearby computer in that network in order to receive data from or supply data to that computer (or the network more generally).

Still another part of the circuitry on IC 10 is one or more direct memory access ("DMA") circuitries 50a-c (collectively or generically referred to simply as DMA circuitry 50). This circuitry may again be per se conventional, and it can be used (e.g., in the conventional manner) to help control reading data from and writing data to memories 120 and 130 with less or no involvement of central processing unit ("CPU") circuitry 60 on IC 10.

IC 10 may also include one or more CPU circuitries 60a-c (collectively or generically referred to simply as CPU circuitry 60). CPU circuitry 60 may be a conventional type of circuitry. Circuitry 60 may be (or may include) firmware and/or software for providing overall control of IC 10.

Still another part of the circuitry of IC 10 may be bus circuitry 70. Bus circuitry 70 provides electrical circuit pathways for data and other information to pass to, from, and/or between other parts of the IC's circuitry (such as controllers 20, 30, and 40, DMA circuitry 50, CPU circuitry 60, and controllable routing circuitry 80, which will be described next). Thus, for example, data may first flow from routing circuitry 80 to DDR 130, at least partly via bus circuitry 70. Later, that same data may flow from DDR 130 to flash memory 120, again at least partly via bus circuitry 70. As another example, data to be stored in the flash memory 120 associated with IC 10 may enter the IC from general-purpose connections 140 and may first flow to DDR 130, at least partly via bus circuitry 70. Later, that same data may be transferred from DDR 130 to flash memory 120, at least partly via bus circuitry 70.

As has already been mentioned briefly, still another part of the circuitry of IC 10 is controllable routing circuitry 80. One possible construction of routing circuitry 80 is like or analogous to a crossbar switch; and because the characteristics of a crossbar switch are so well known, it will be convenient to at least initially describe circuitry 80 in crossbar switch terms.

In general, a crossbar switch can connect any "port" served by that switch to any other port served by that switch. In FIG. 1, routing circuitry 80 is shown as having nine ports P1-P9. Ports P1-P3 are connected to bus circuitry 70. Ports P4-P9 are (or are connected to) input/output ("IO") pins of IC 10. Thus routing circuitry 80 is controllable to (in general) connect any of ports P1-P9 to any other one of those ports, and to make different such port-to-port connections at different times during its operations. (Some such connections may never be necessary and may therefore be omitted from the capabilities of routing circuitry 80. For example, it may never be necessary to connect any of ports P1-P3 to one another, and so such always-unnecessary interconnection possibilities may be omitted from routing circuitry 80.)

In the event that IC 10 is part of a larger clustered flash memory storage system that includes multiple instances of ICs like IC 10, the various ICs 10 in that system are connected to one another by inter-IC connections 210 that extend between the ports P4-P9 of different ones of those ICs. For example, each such connection 210 may be a high-speed serial transmission link (controlled by the SERDES circuitry that is described later in this specification). A typical such connection 210 may extend between P4 of a first IC 10 and P6 of a second IC 10. A second such connection 210 may extend between P5 of the second IC 10 and P9 of a third IC 10. Some examples of arrangements (i.e., topologies) of multiple ICs 10 and connections 210 between the P4-P9 ports of those ICs as described in this paragraph are shown in FIGS. 2-4 and further described below.

It is to be understood that FIG. 1 is only an example of how IC 10 may be constructed. Such an IC may not need to have all of the structure shown in FIG. 1 and described herein, except that all such ICs will include at least controllable routing circuitry 80.

Figure 3:
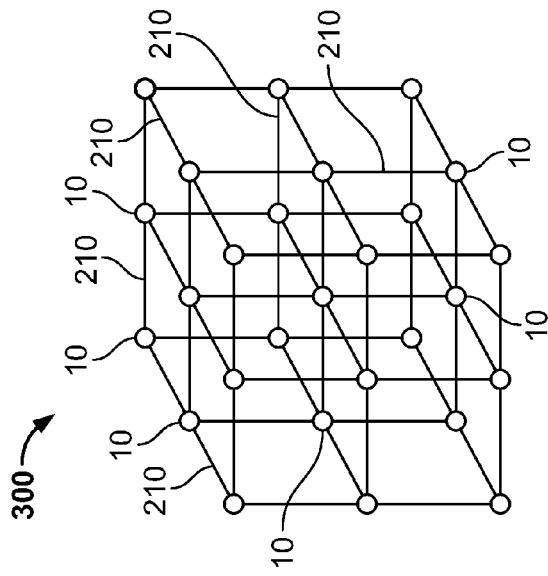
FIG. 3 is similar to FIG. 2 for another illustrative system topology in accordance with the disclosure.
Figure 4:
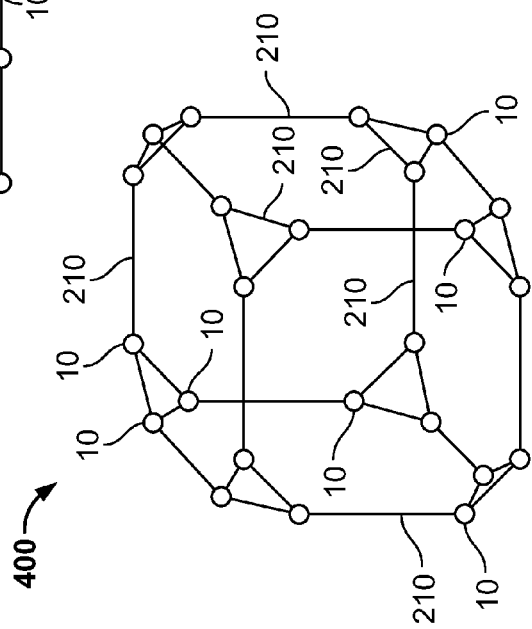
FIG. 4 is similar to FIG. 2 for yet another illustrative system topology in accordance with the disclosure.
Figure 2:
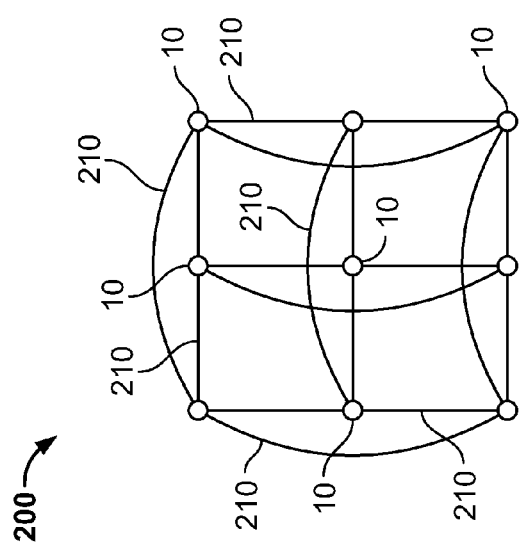
FIG. 2 is a simplified logical diagram of an example of a system topology in accordance with the disclosure.

FIGS. 2-4 show some examples of how relatively large numbers of ICs like IC 10 in FIG. 1 may be connected to one another to form larger clustered flash storage systems (e.g., system 200 in FIG. 2, system 300 in FIG. 3, or system 400 in FIG. 4). In each of FIGS. 2-4 each small circle 10 represents an instance of an IC like 10 in FIG. 1. (Only some representative ones of the circles have reference number 10 actually shown in FIGS. 2-4 in order to avoid over-crowding the drawings. But each circle is in fact an instance of IC 10.) Also in each of FIGS. 2-4 each line 210 represents a connection (e.g., a high-speed serial communication link) between one of the ports like P4-P9 of each of the ICs at each end of that link. (Again, not all links in FIGS. 2-4 are reference numbered 210. But each line in each of these FIGS. represents a communication link 210.)

The systems shown in FIGS. 2-4 illustrate just some examples of the various system topologies that can be used. Thus FIG. 2 shows an example of what may be called a two-dimensional ("2D") mesh. FIG. 3 shows an example of what may be called a three-dimensional ("3D") mesh. FIG. 4 shows an example of what may be called a triangle cube.

For avoidance of doubt on this score, we note again that each of the connections 210 going to any of the ICs 10 in any of FIGS. 2-4 goes to a respective one of the ports like P4-P9 of that IC. For example, considering the upper left IC 10 in FIG. 2, the connection 210 at the 2 o'clock position may connect to port P4 of that IC, the connection 210 at the 3 o'clock position may connect to port P5 of that IC, the connection 210 at the 6 o'clock position may connect to port P8 of that IC, and the connection 210 at the 7 o'clock position may connect to port P7 of that IC.

In clustered flash memory storage systems that include multiple instances of ICs like IC 10 (e.g., in systems such as are illustrated by FIGS. 2-4), the controllable routing circuitry 80 in any given IC 10 may be required to provide different routings of data signals and other information at different times. For example, at some times the routing circuitry 80 in a particular IC 10 may be required to route signals between the bus circuitry 70 of that IC and one of the "external" ports P4-P9 of that IC. This may be required (for example) when data needed by the IC 10 being discussed (e.g., to satisfy a data request received via the PCIE circuitry 40 of that IC) is stored in the flash memory 120 associated with a different IC 10 in the system. In such a case, the needed data must be retrieved from the remote flash memory and routed through the controllable routing circuitry 80 of one or more other ICs 10 until it reaches one of external ports P4-P9 of the IC 10 being discussed. The routing circuitry 80 in that IC is then controlled to route the data from that external port to the bus circuitry 70 of that IC. From there the data can be further routed or handled to satisfy the PCIE data request.

At other times the routing circuitry 80 in a particular IC 10 may be required to route signals between two of its external ports P4-P9. This may be required (for example) when the IC 10 being discussed is between two other ICs 10, one of which is calling for data that is stored in the flash memory 120 associated with yet another IC 10. To give a concrete example of such a case, suppose the IC 10 in the center of FIG. 2 is calling for data stored in the flash memory 120 associated with the upper-right corner IC 10 of that FIG. One possible routing for that data is through the IC 10 that is midway along the right-hand side of FIG. 2. The routing circuitry 80 in that last-mentioned IC 10 can then be controlled to route data it receives (via its external port P4-P9 having connection 210 to upper-right IC 10) to its other external port P4-P9 having connection 210 to the IC 10 in the center. In such a case it may not be necessary for an IC 10 that is merely passing data through its routing circuitry 80 from one IC 10 to another IC 10 to do more with the data than is required to appropriately control that routing circuitry to effect the required pass-through routing. For example, it may not be necessary for an IC 10 that is performing such a pass-through to have the data being passed through applied to any of its other components such as bus 70, etc. The routing circuitry 80 in each IC 10 may itself be capable of determining what routing is required for various "packets" of data, and then controlling itself to effect the routing required for each packet. This will be further discussed later in this specification.

Figure 5:
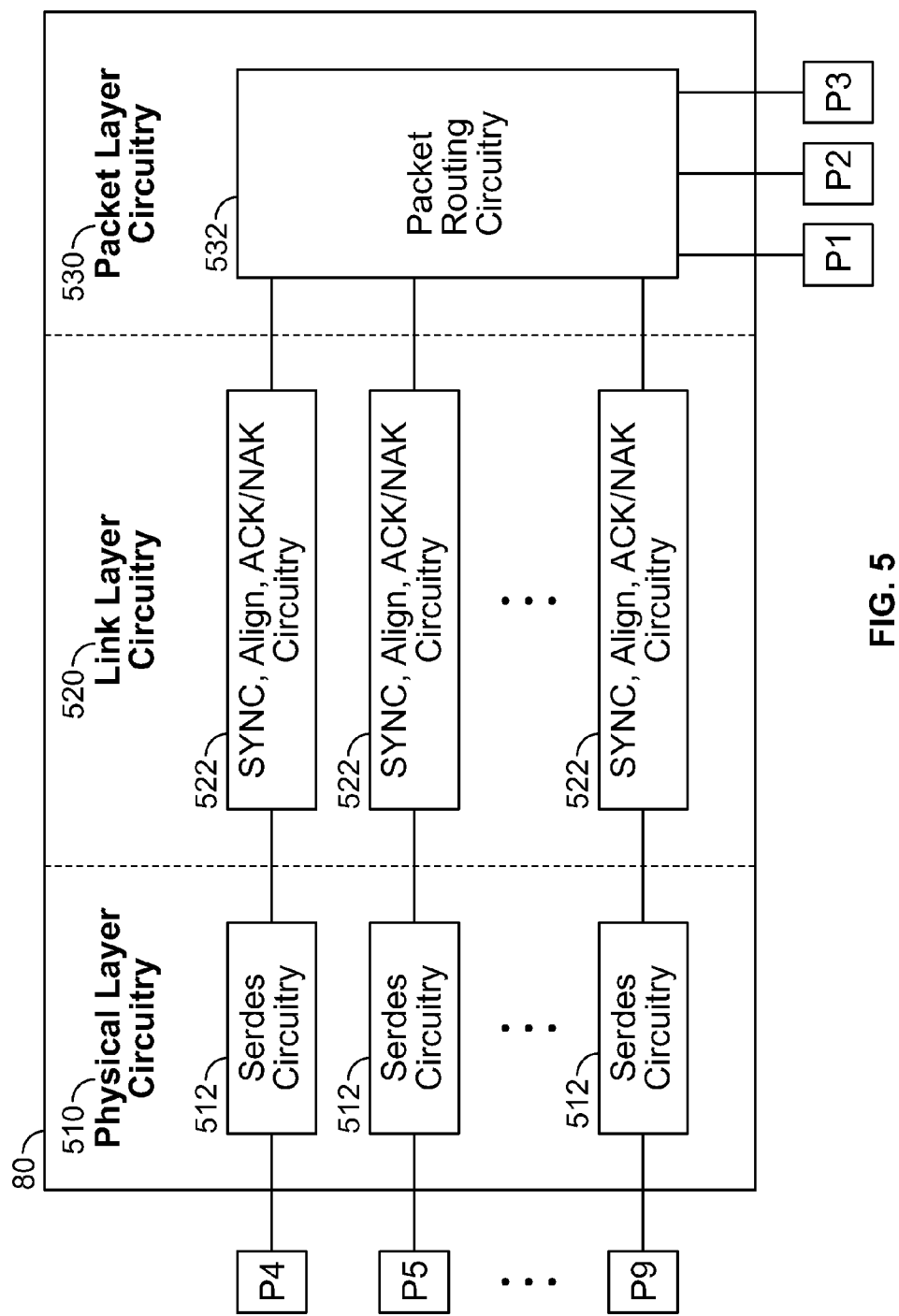
FIG. 5 is a more detailed (but still simplified) schematic block diagram of an illustrative embodiment of a portion of the FIG. 1 circuitry in accordance with the disclosure.

FIG. 5 shows an illustrative embodiment of how controllable routing circuitry 80 in an IC 10 may be constructed. In this embodiment, circuitry 80 includes physical layer circuitry 510, link layer circuitry 520, and packet layer circuitry 530. The embodiment shown in FIG. 5 assumes that communication links like 210 in FIGS. 1-4 are high-speed serial communication links, but that more parallel communication is generally used for data elsewhere on-board IC 10 (e.g., in bus circuitry 70). Physical layer 510 includes a plurality of serializer/deserializer ("SERDES") circuitries 512, each of which is associated with a respective one of external ports P4-P9 as in FIG. 1. Each SERDES circuit 512 (which can be per se conventional) can convert a serial data signal received via the associated external, serial port P to parallel data. This parallel data is applied to further circuitry 522 in the channel that is coupled to that SERDES. In the other direction, each SERDES circuit 512 can convert parallel data received from that channel's circuitry 522 to serial form for outputting via the associated external, serial port P.

For each channel that includes an external port P4-P9 and SERDES circuitry 512, link layer 520 includes circuitry 522 for performing (per se conventional) functions such as synchronization ("SYNC") (e.g., between an incoming data signal clock and a clock on-board IC 10), alignment ("ALIGN") (e.g., of groups of incoming bits with proper byte boundaries), and acknowledge/non-acknowledge ("ACK/NAK") signalling (e.g., to indicate whether or not data has been properly received). In the in-bound direction, each of circuitries 522 applies the data that it has processed in the above respects to packet routing circuitry 532. Each circuitry 522 also passes outbound data from circuitry 532 to the associated SERDES 512. Less processing by the link layer circuitry may be required for out-bound data, but link layer circuitry 522 may still perform some functions such as handling ACK/NAK signalling for out-bound data.

Packet layer circuitry 530 may perform such functions as identifying packets in data applied to it. An illustrative embodiment of a typical packet is shown in FIG. 6. For example, a packet may begin with an IC 10 identification ("ID") identifying a particular IC 10 (e.g., in systems like those shown in FIGS. 2-4) where the data in the packet is to be stored or is otherwise needed. In other words, the IC 10 ID information in a packet may include an identification of the IC 10 to which that packet should be routed. Also near the start, each packet may begin with memory ("MEM") address information. This may identify the location(s) where the data in the packet should be stored (e.g., where in the flash memory 120 associated with the IC 10 identified by the IC 10 ID that data should be stored).

The packet "header" information such as that described in the previous paragraph may be followed by a predetermined (or header-specified) amount of "data payload" (i.e., the actual data that is of interest). The packet may conclude with cyclic redundancy check ("CRC") or other similar information (e.g., for helping to ensure that the payload data has been received correctly, etc.).

Returning to packet layer circuitry 530 in FIG. 5, it will be noted that in addition to communicating with the channels that include external, serial ports P4-P9, packet routing circuitry 532 also communicates with "internal" ports P1-P3 (i.e., the connections between bus circuitry 70 and routing circuitry 80). Internal ports P1-P3 are assumed to be parallel ports. Data at all of ports P1-P9 preferably has the same packet structure or organization (e.g., as shown in FIG. 6). Packet layer circuitry 530 can therefore identify packets of data in data it receives from any of ports P1-P9. Once a packet has been identified at any of ports P1-P9, packet routing circuitry 532 can use the IC 10 ID information in the header of that packet to select which of the other of ports P1-P9 to route that packet to, and to actually effect that routing of the packet. For example, packet layer circuitry 530 may determine that a packet received via internal port P2 includes the IC 10 ID of another IC 10 that is connected to its external port P7. Packet routing circuitry 532 will then operate to route that packet from port P2 to port P7. As another example, packet layer circuitry 530 may determine that a packet received via external port P6 includes the IC 10 ID of another IC 10 that is connected to its external port P9. Packet routing circuitry 532 will then operate to route that packet from port P6 to port P9. As a final example, packet layer circuitry 530 may determine that a packet received via external port P8 includes the IC 10 ID of the IC 10 that includes this routing circuitry. Packet routing circuitry 532 may then operate to route that packet from port P8 to one of internal ports P1-P3.

Figure 7:
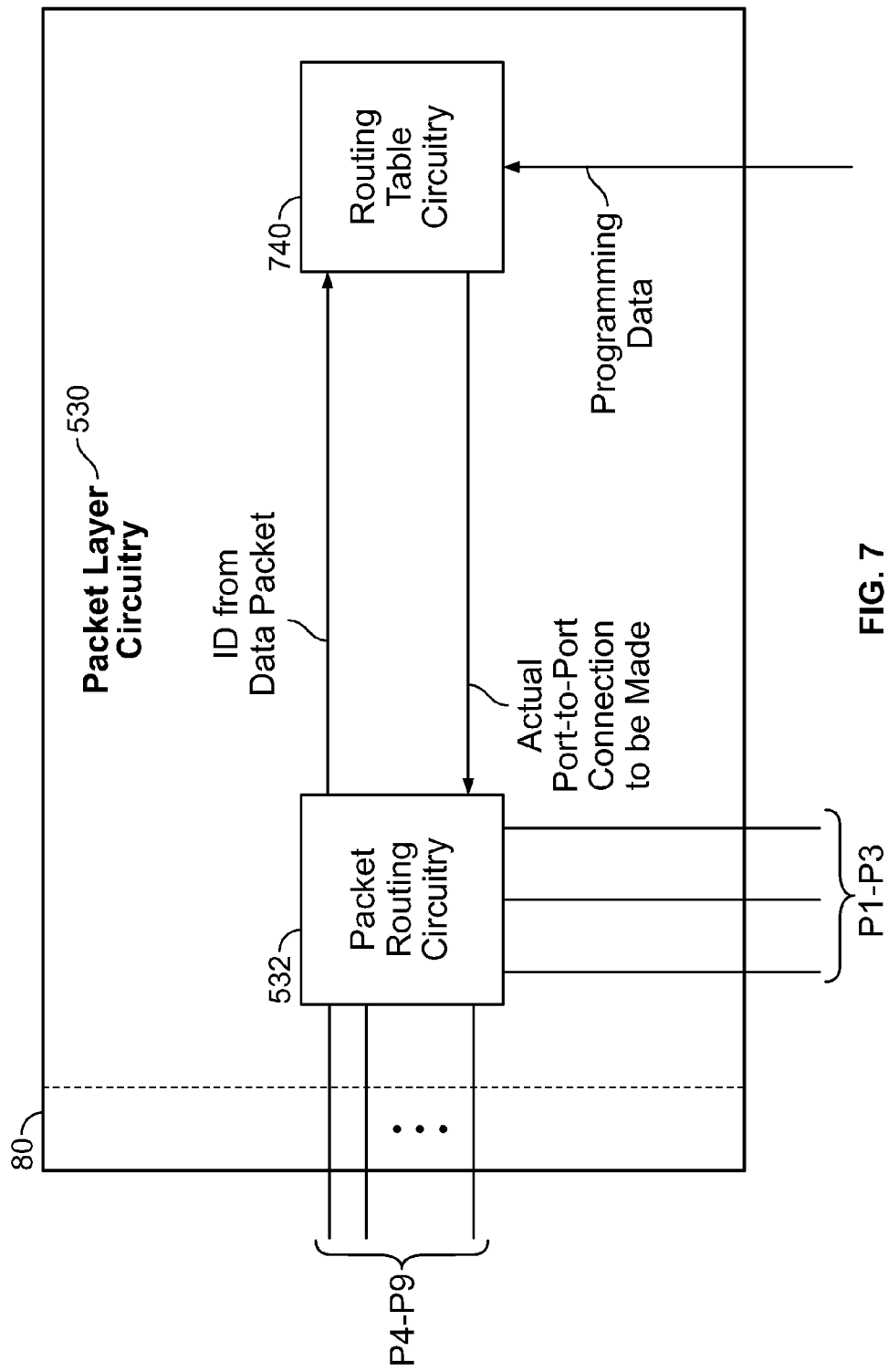
FIG. 7 is similar to FIG. 5, but shows an illustrative embodiment of more possible details in accordance with the disclosure.

FIG. 7 shows an illustrative embodiment of a possible modification or extension of what is shown in FIG. 5. In particular, FIG. 7 shows that packet layer circuitry 530 in controllable routing circuitry 80 may include routing table circuitry 740, which can be used to map ID information inside each data packet (e.g., the IC 10 ID information shown in FIG. 6) to an identification of the actual egress port P1-P9 to which that packet should be routed to help the packet reach its intended destination. For example, routing table 740 may be pre-programmed with programming data to match the interconnect topology (e.g., as in any of FIGS. 2-4) of the clustered flash storage system of which circuitry 740 is a part. Circuitry 740 can receive from packet routing circuitry 532 the ID information from a packet that needs to be routed. Circuitry 740 can convert that ID information to an identification of the port that this packet needs to be routed to in order to make that packet reach its intended destination (or to at least advance the packet along a chain of ICs 10 toward its intended destination). The port identification output by circuitry 740 is applied to packet routing circuitry 532 to control the routing effected by circuitry 532.

Figure 8:
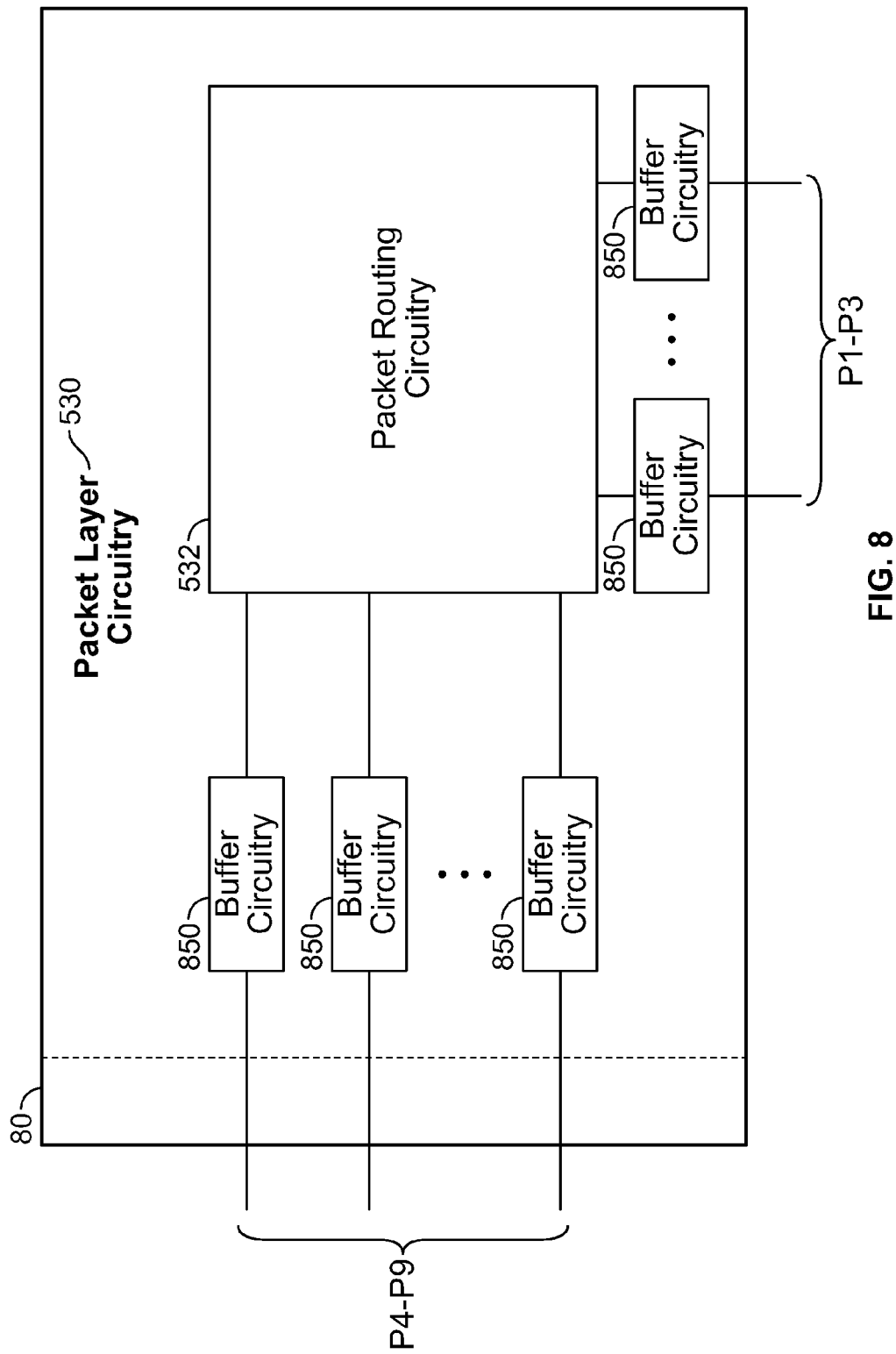
FIG. 8 is again similar to FIG. 5, but shows an illustrative embodiment of still more possible details in accordance with the disclosure.

FIG. 8 shows an illustrative embodiment of another possible modification or extension of what is shown in FIG. 5. In particular, FIG. 8 shows that routing circuitry 80 may include buffer circuitry 850 for buffering data in each of the port channels of packet routing circuitry 532. Buffer circuitry 850 may be input buffer circuitry and/or output buffer circuitry.

Figure 9:
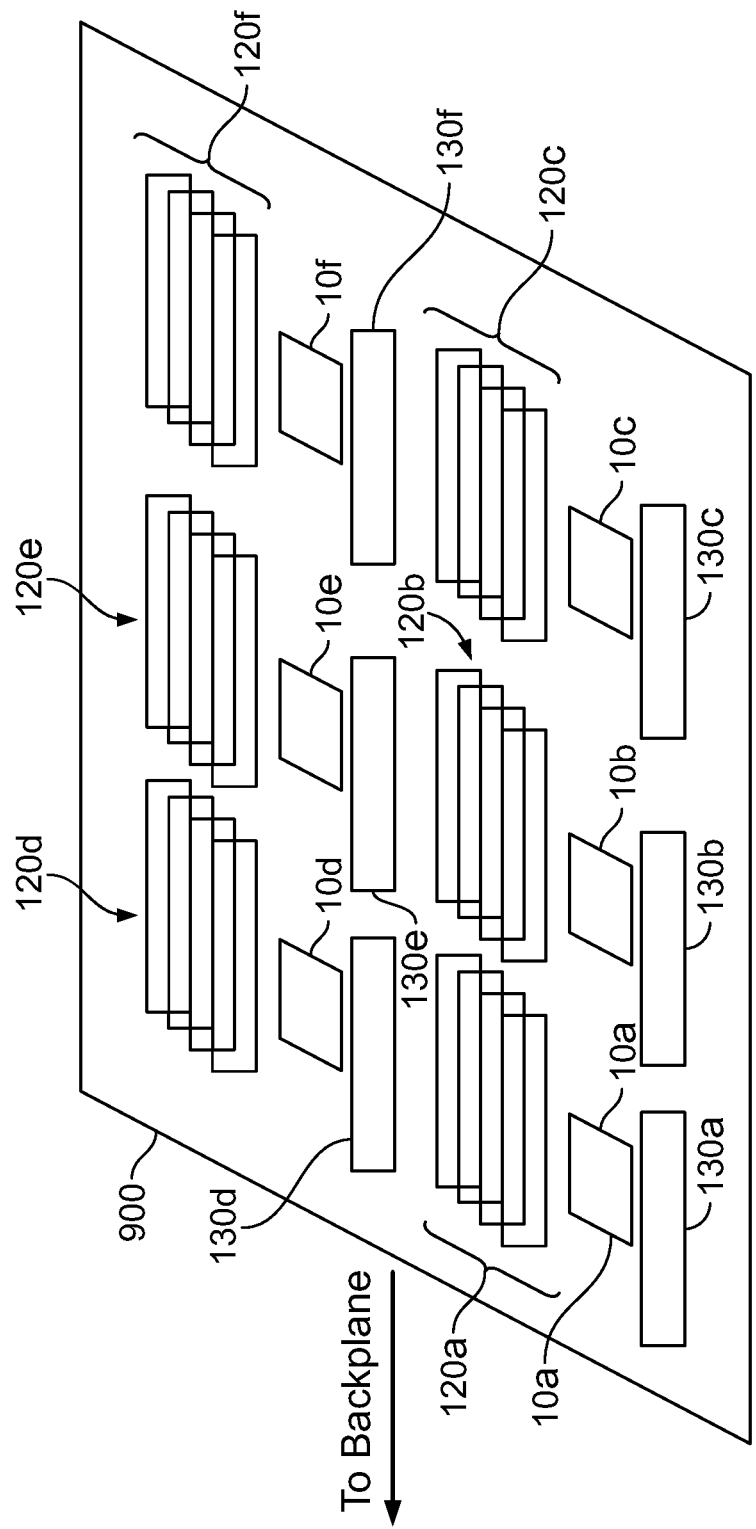
FIG. 9 is a simplified schematic block diagram of an illustrative embodiment of a larger system (or a representative portion of a larger system) in accordance with the disclosure.

FIG. 9 shows an illustrative embodiment of a physical layout of several ICs 10 and their associated cache 130 and flash 120 memories on a printed circuit board ("PCB") 900. For example, IC 10*a* has associated cache (e.g., DDR) memory circuitry 130*a* and several channels of associated flash memory 120*a*. There are six such groups of circuit elements (respectively identified using reference suffix letters a-f). PCB 900 provides all necessary connections between the components of each such group (e.g., by means of PCB circuit traces). PCB 900 also similarly provides connections 210 (FIGS. 1-4) between the ICs 10 on the PCB, as well as other possible connections (e.g., 140 in FIG. 1) to and/or from one or more of those ICs 10. Assuming that each IC 10 on PCB 900 has 4 GB of DDR memory 130 and 512 GB of flash storage 120, PCB 900 provides a total of 24 GB of DDR memory and 3 TB (terabytes) of flash memory. Multiple PCBs like 900 may be mounted on and interconnected by a backplane or chassis. For example, if eight PCBs 900 are thus used together, the system has a total of 48 nodes 10 with a total of 192 GB of DDR memory and 24 TB of flash memory.

Figure 10:
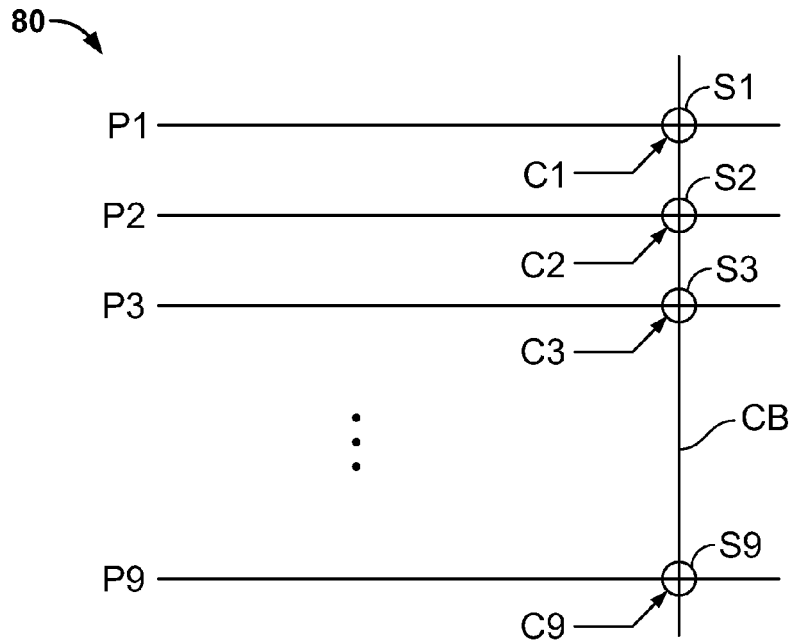
FIG. 10 is a simplified schematic block diagram of an illustrative embodiment of a portion of the FIG. 1 circuitry in accordance with the disclosure.

FIG. 10 shows an illustrative construction of crossbar-type switching circuitry that can be included in (or equivalently implemented in) controllable routing circuitry 80 in accordance with this disclosure. Each horizontal line in FIG. 10 represents one or more signals flowing to and from the port P identified at the left-hand end of that line. (These horizontal lines will sometimes be referred to as horizontal conductors, using the same references (i.e., P1-P9) as are used for the ports they serve.) Vertical line CB represents one or more "crossbar" conductors that cross some or all of horizontal conductors P1-P9. Each open circle S1-S9 represents switches (typically transistor switches) that can be controllably closed to selectably interconnect the horizontal and vertical conductors that pass through that circle. The signals that control whether each switch S is open or closed are shown as control signals C1-C9.

As an example of the operation of the FIG. 10 circuitry, if it is desired to connect port P2 to port P9, control signals C2 and C9 are used to close switches S2 and S9. This connects horizontal conductors P2 to horizontal conductors P9 through closed switches S2 and S9 and crossbar conductors CB. All other control signals (i.e., C1 and C3-C8) cause their associated switches (i.e., S1 and S3-S8) to be open.

Figure 11:
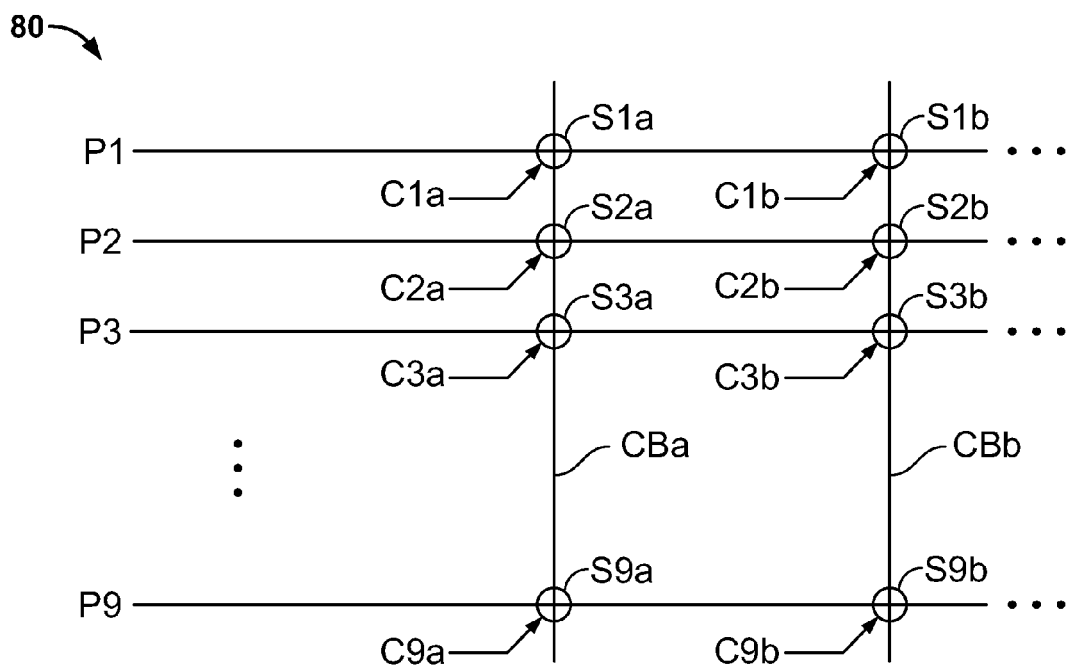
FIG. 11 is a simplified schematic block diagram of an another illustrative embodiment of a portion of the FIG. 1 circuitry in accordance with the disclosure.

If it is desired to be able to concurrently provide more than one port-to-port connection through circuitry of the general type shown in FIG. 10, then that circuitry can be extended as shown in FIG. 11. In FIG. 11 the circuitry has two or more crossbar conductors (or conductor sets) CBa, CBb, etc. Each CB has its own set of switches Sa, Sb, etc., for selectably connecting that CB to any of the horizontal conductors P1-P9. Control signals Ca, Cb, etc. are provided for all of the switches S. Thus each CB can be used to independently connect any two of ports P1-P9. For example, CBa and its associated switches S1*a* and S9*a* (respectively controlled by control signals C1*a* and C9*a*) can be used to connect ports P1 and P9 to one another; and at the same time, CBb and its associated switches S2*b* and S3*b* (respectively controlled by control signals C2*b* and C3*b*) can be used to connect ports P2 and P3 to one another. There is no interference or conflict between the thus-concurrent connections between ports P1 and P9 and between ports P2 and P3.

Control signals C in FIGS. 10 and 11 can be based on packet header information (e.g., IC 10 ID data in FIG. 6) as described earlier in this specification. That packet header information may have been subject to some translation (e.g., as in routing table circuitry 740 in FIG. 7) prior to being usable as actual control signals C. Thus, for example, the signals on the line labelled "actual port-to-port connection to be made" in FIG. 7 may be the actual signals C for controlling the switches S in circuitry of the type shown in FIGS. 10 and 11.

It will be understood that whereas controllable routing circuitry 80 in FIG. 1 and elsewhere throughout this specification can be constructed as shown in FIG. 10 or FIG. 11, those skilled in the art will know of other ways that routing circuitry 80 can be equivalently constructed. For example, networks of controllable multiplexers can be used to provide controllable routing circuitry 80 that is suitably equivalent in terms of capability to circuitry of the type shown in FIGS. 10 and 11.

From the foregoing it will be appreciated that this disclosure provides a distributed system that has tightly coupled memory, flash storage, and interconnect. The disclosure has a scalable distributed system architecture without a need for external controllable routing components (because the controllable routing circuitry 80 is on-board ICs 10). The disclosure provides a distributed platform that can be used for high performance computing, and/or for high performance database and distributed file system service.

It will be understood that the foregoing is only illustrative of the principles of this disclosure, and that various modifications can be made by those skilled in the art without departing from the scope and spirit of the disclosure. For example, instead of using a PCIE interface 40 to circuit components outside the clustered flash storage system, any other suitable type of interface may be used for that purpose.

What is claimed is:

1. An integrated circuit comprising:
   flash memory controller circuitry;
   a plurality of data signal ports including at least a plurality of external ports and an internal port; and
   controllable routing circuitry comprising programmable routing table circuitry configured to convert an identification of another instance of said integrated circuit to a port-to-port connection to be made by the controllable routing circuitry, wherein the controllable routing circuitry is configured to:
   receive, over a first external port, signals indicative of (1) a flash memory address, (2) data payload, and (3) an identification of a destination integrated circuit corresponding to a desired destination of the flash memory address and the data payload; and
   transmit the flash memory address and the data payload from the first external port to a destination port, wherein:
   if the integrated circuit is the destination integrated circuit, the destination port is the internal port, which transmits at least the data payload to the flash memory controller circuitry on the integrated circuit; and
   if another integrated circuit is the destination integrated circuit, the destination port is a second external port in the plurality of external ports as determined by cross-referencing the identification of the destination integrated circuit with said routing table circuitry, wherein the flash memory controller circuitry, the plurality of data signal ports, and the controllable routing circuitry are implemented in a System-on-Chip (SoC) configuration of the integrated circuit.

2. The integrated circuit defined in claim 1 wherein the flash memory controller circuitry is adapted for controlling a plurality of flash memory channels.

3. The integrated circuit defined in claim 1 further comprising:
   cache memory controller circuitry that comprises double-data-rate synchronous dynamic random access memory ("DDR SDRAM") controller circuitry.

4. The integrated circuit defined in claim 1 wherein at least some of the external ports are adapted for connection to similar ports of a similar or another instance of said integrated circuit.

5. The integrated circuit defined in claim 1 wherein the controllable routing circuitry comprises crossbar switch circuitry.

6. The integrated circuit defined in claim 1 further comprising:
   central processing unit ("CPU") circuitry for controlling at least some operations of at least some other circuitry on the integrated circuit.

7. The integrated circuit defined in claim 3 further comprising:
   direct memory access ("DMA") circuitry for controlling at least some operations of the flash memory controller circuitry and the cache memory controller circuitry.

8. The integrated circuit defined in claim 1 further comprising:
   interface circuitry for allowing the integrated circuit to be coupled to general-purpose device interconnections.

9. The integrated circuit defined in claim 8 wherein the interface circuitry comprises peripheral component interface ("PCI") circuitry or peripheral component interface express ("PCIE") circuitry.

10. The integrated circuit defined in claim 1 wherein the routing table circuitry is programmable with programming data for use by the routing table circuitry in converting the identification to the port-to-port connection.

11. Memory circuitry comprising:
    a plurality of integrated circuits ("ICs"), each of which includes (1) flash memory controller circuitry, (2) a plurality of data signal ports comprising a plurality of external ports and one or more internal ports, (3) bus circuitry for conveying data signals between the one or more internal ports and the flash memory controller, and (4) controllable routing circuitry, comprising programmable routing table circuitry for converting identification of another respective one of the integrated circuits to a port-to-port connection to be made by the controllable routing circuitry, and for selectably conveying signals (a) between two selected external ports and (b) between a selected internal port and a selected external port, wherein the selected ports are selected based on a desired destination of a data packet as determined by the controllable routing circuitry, wherein the flash memory controller circuitry, the plurality of data signal ports, the bus circuitry, and the controllable routing circuitry are implemented in a System-on-Chip configuration of each IC;
    a plurality of flash memory circuits, each of which is connected to a respective one of the ICs via the flash memory controller of that IC; and
    a plurality of inter-IC connections, each of the ICs having at least one inter-IC connection extending to another of the ICs so that each inter-IC connection extends between first and second ICs associated with that inter-IC connection, and each of the inter-IC connections connecting to a respective one of the external ports of each of the ICs associated with that inter-IC connection.

12. The memory circuitry defined in claim 11 wherein each of the ICs further includes:
    circuitry for controlling the routing circuitry of the respective one of the ICs with respect to which of the data signal ports that routing circuitry conveys signals between.

13. The memory circuitry defined in claim 12 wherein the circuitry for controlling of each of the ICs comprises:
    circuitry for deriving from signals applied to the muting circuitry of that IC signal information for selecting which of the data signal ports that routing circuitry conveys signals between.

14. The memory circuitry defined in claim 13 wherein the circuitry for controlling of each of the ICs is programmable with additional signal information for controlling which of the data signal ports that routing circuitry conveys signals between.

15. The memory circuitry defined in claim 11 wherein the routing table circuitry of each of the ICs is programmable with programming data for use by that routing table circuitry in converting the signal information to the actual port-to-port connection.

16. A method comprising:
receiving, using controllable routing circuitry of an integrated circuit, wherein the controllable routing circuitry comprises programmable routing table circuitry configured to convert an identification of another instance of said integrated circuit to a port-to-port connection to be made by the controllable routing circuitry, signals indicative of (1) a flash memory address, (2) data payload, and (3) an identification of a destination integrated circuit corresponding to a desired destination of the flash memory address and the data payload; and
using the identification to control the controllable routing circuitry so that at least the flash memory address and the data payload are transmitted to the destination integrated circuit, such that:
if the integrated circuit is the same as the destination integrated circuit, transmitting the data payload from a first external port to an internal port, which transmits at least the data payload to the flash memory controller circuitry on the first integrated circuit; and
if the first integrated circuit is not the same as the destination integrated circuit, transmitting the data payload from the first external port to a second external port as determined by cross-referencing the identification of the destination integrated circuit with said routing table circuitry, wherein the first external port, the second external port, the internal port, and the controllable routing circuitry are implemented in a System-on-Chip (SoC) configuration of the integrated circuit.

17. The method defined in claim 16 wherein the using comprises:
applying the identification to the routing table circuitry in order to convert the identification to an actual port-to-port connection to be made; and
applying the actual port-to-port connection to the controllable routing circuitry.

18. The method defined in claim 17 further comprising:
programming the routing table circuitry with programming data for use by the routing table circuitry to convert the identification to the actual port-to-port connection to be made.

19. The method defined in claim 16 further comprising:
operating the flash memory controller circuitry of the integrated circuit having the identification to use the flash memory address to store the data payload at that flash memory address of the integrated circuit, wherein the flash memory controller circuitry is also implemented in the SoC configuration of the integrated circuit.

20. The integrated circuit defined in claim 1 further comprising bus circuitry configured to convey data signals to and from the flash memory controller circuitry, wherein the internal port is connected to the bus circuitry and the data payload is transmitted over the bus circuitry.

21. The integrated circuit defined in claim 20 wherein the data packet is received over the external port and transmitted over the internal port.

22. The integrated circuit of claim 1, wherein the controllable routing circuitry is configured to convey additional signals to other integrated circuits without input from any routing components that are external to the integrated circuit.

23. The memory circuit of claim 11, wherein the controllable routing circuitry selectably convey additional signals to other integrated circuits without input from any routing components that are external to the integrated circuit.

24. The method of claim 16, wherein additional signals can be selectably conveyed among integrated circuits without input from any routing components that are external to the integrated circuit.

* * * * *